(12) United States Patent
Tsai et al.

(10) Patent No.: US 6,638,830 B1
(45) Date of Patent: Oct. 28, 2003

(54) METHOD FOR FABRICATING A HIGH-DENSITY CAPACITOR

(75) Inventors: Teng-Chun Tsai, Hsin-Chu (TW); Chia-Lin Hsu, Taipei (TW); Yi-Fang Cheng, Hsin-Chu Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/065,104

(22) Filed: Sep. 18, 2002

(51) Int. Cl.[7] ............................................. H01L 21/20
(52) U.S. Cl. ...................... 438/397; 438/253; 438/254; 438/692; 257/306; 257/309
(58) Field of Search ................................ 438/397, 240, 438/239, 243, 253, 254, 255, 396, 398, 633, 692; 257/306, 309

(56) References Cited

U.S. PATENT DOCUMENTS 6,165,804 A * 12/2000 Fazan et al. .................. 438/3
6,168,988 B1 * 1/2001 Schindler et al. ........... 438/253
6,518,120 B2 * 2/2003 Park .......................... 438/244

\* cited by examiner

*Primary Examiner*—Phat X. Cao
*Assistant Examiner*—Theresa T. Doan
(74) *Attorney, Agent, or Firm*—Winston Hsu

(57) ABSTRACT

A method of fabricating a high-density capacitor. At least one first trench is formed in a dielectric layer positioned on a semiconductor substrate. A first liner layer and a first conductive layer are formed on the semiconductor substrate followed by a first planarization process. At least one second trench having a joint side wall with the first trench is formed in the dielectric layer. A capacitor dielectric layer, a second liner layer, and a second conductive layer are formed on the semiconductor substrate followed by a second planarization process. The surfaces of the first conductive layer and the second conductive layer are then exposed to form a high-density capacitor having a three-dimensional structure.

21 Claims, 10 Drawing Sheets

METHOD FOR FABRICATING A HIGH-DENSITY CAPACITOR

BACKGROUND OF INVENTION

1. Field of the Invention

The present invention relates to a method for fabricating a high-density capacitor, and more particularly, to a method for fabricating a high-density capacitor having a vertical three-dimensional (3-D) structure.

2. Description of the Prior Art

In the present semiconductor mix mode integrated circuit process, most often the conventional plate capacitor is applied to connect with a metal oxide semiconductor (MOS) transistor to form a memory device. The conventional plate capacitor has a three-layer plate stacked structure composed of a bottom electrode plate, a capacitor dielectric layer, and a top electrode plate, and is formed by utilizing different photo masks three times to define patterns of each layer. However, the plate stacked structure needs a large chip area to achieve demands of the capacitor. Therefore, reducing the demand space that defines the capacitor structure on the chip (i.e. increase the capacitor density), raising the device integration, decreasing numbers of the photo masks, and lowering the production costs, have become the most important points of fabricating the capacitor structure.

SUMMARY OF INVENTION

It is therefore a primary objective of the claimed invention to provide a method for fabricating a high-density capacitor to increase the capacitor density and raise the device integration.

It is another object of the claimed invention to provide a high-density capacitor to decrease numbers of the photo masks and lower the production costs.

According to the preferred embodiment of the claimed invention, the high-density capacitor is formed in a semiconductor substrate that comprises a dielectric layer. First, at least one first trench is formed in a dielectric layer positioned on a semiconductor substrate. A first liner layer and a first conductive layer are formed on the semiconductor substrate followed by a first planarization process. At least one second trench is formed in the dielectric layer, and the second trench having a joint side wall with the first trench. A capacitor dielectric layer, a second liner layer, and a second conductive layer are formed on the semiconductor substrate followed by a second planarization process. The surfaces of the first conductive layer and the second conductive layer are then exposed to form a high-density capacitor having a three-dimensional (3-D) structure.

In the claimed invention, the high-density capacitor uses the 3-D structure so as to reduce the chip area substantially, increase the capacitor density, and increase the device integration. In addition, the first conductive layer and the second conductive layer are both lodged into the dielectric layer positioned on the semiconductor substrate, so that the capacitor process of the claimed invention can be integrated with other interconnection processes. Only one photo mask is utilized to form the trench structures of the capacitor and the interconnection so as to simplify the processes, decrease numbers of the photo masks, and reduce the production costs.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
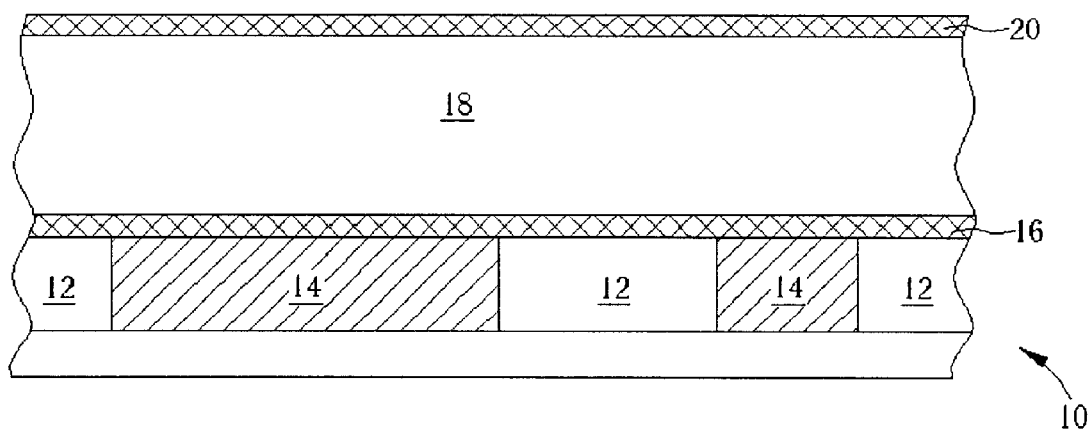
FIG. 1 to FIG. 7 are schematic diagrams of a method for fabricating a high-density capacitor according to the present invention.

Please refer to FIG. 1 to FIG. 7, which are schematic diagrams of a method for fabricating a high-density capacitor 42 on a semiconductor substrate 10 according to the present invention. In order to explain the advantages of simplifying the manufacturing process of the present invention, the high-density capacitor process and the interconnection process are integrated and illustrated as shown in FIG. 1 to FIG. 7. However, the high-density capacitor process of the present invention is not limited to this. The high-density capacitor having a vertical three-dimensional (3-D) structure also has an advantage of reducing the chip area. As shown in FIG. 1, the semiconductor substrate 10 includes a dielectric layer 12, a conductive layer 14 formed on a predetermined region of the semiconductor substrate 10, and a mask layer 16 that covers the conductive layer 14. In the preferred embodiment of the present invention, the mask layer 16 is made of silicon nitride or silicon carbide, and is used to prevent the surface structure of the conductive layer 14 from being over-etched in the subsequent processes. However, the mask layer 16 can be omitted depending on demands of the manufacturing process.

In addition, the semiconductor substrate 10 also includes a dielectric layer 18 formed on the mask layer 16 and a mask layer 20 formed on the dielectric layer 18. The dielectric layer 18 is used to form a capacitor structure and an interconnection structure connected to the conductive layer 14. The dielectric layer 18 is made of a silicon oxide material comprising silicon dioxide or fluorinated silicate glass (FSG), or a low-k dielectric material having a dielectric constant less than 3, such as hydrogen silsesquioxane (HSQ) and FLARE ™, or an ultra low-k dielectric material having small opening structures. In the preferred embodiment of the present invention, the mask layer 20 is made of silicon nitride, and used to protect and increase the hardness of the low-k dielectric layer 18, and can be omitted depending on demands of the manufacturing process.

Figure 2:
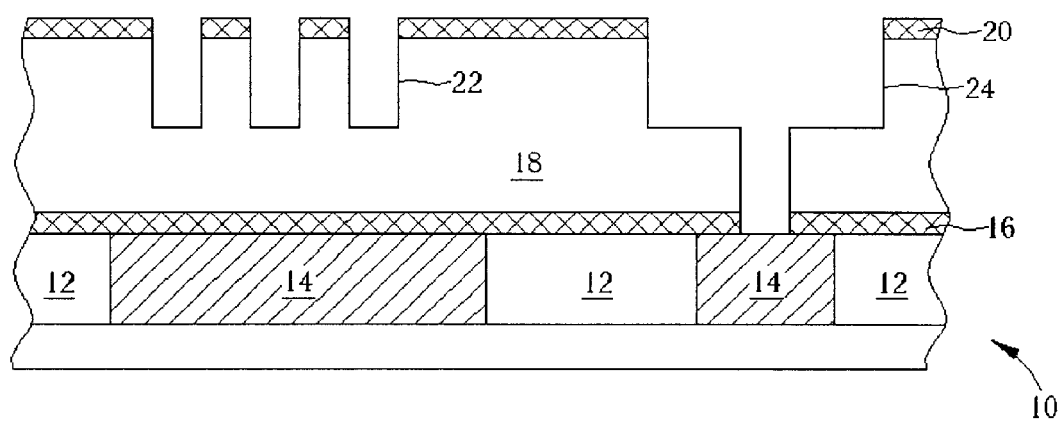

As shown in FIG. 2, a photo-etching process (PEP) is performed to remove portions of the mask layer 20 and the dielectric layer 18 to form at least one trench 22 and an interconnection structure 24 penetrating to a surface of the conductive layer 14 in the dielectric layer 18. The trenches 22 are used to define a bottom electrode plate structure of the capacitor, and the interconnection structure 24 is used to define a single damascene structure, a dual damascene structure, a contact plug, or a landing via. In the preferred embodiment of the present invention, an etching stop layer (not shown in FIG. 2) can be formed selectively in the dielectric layer 18 to assist in defining a contour of the interconnection structure 24. For example, the etching stop layer could be utilized to be an etching end point of an upper trench of the dual damascene structure.

Figure 3:
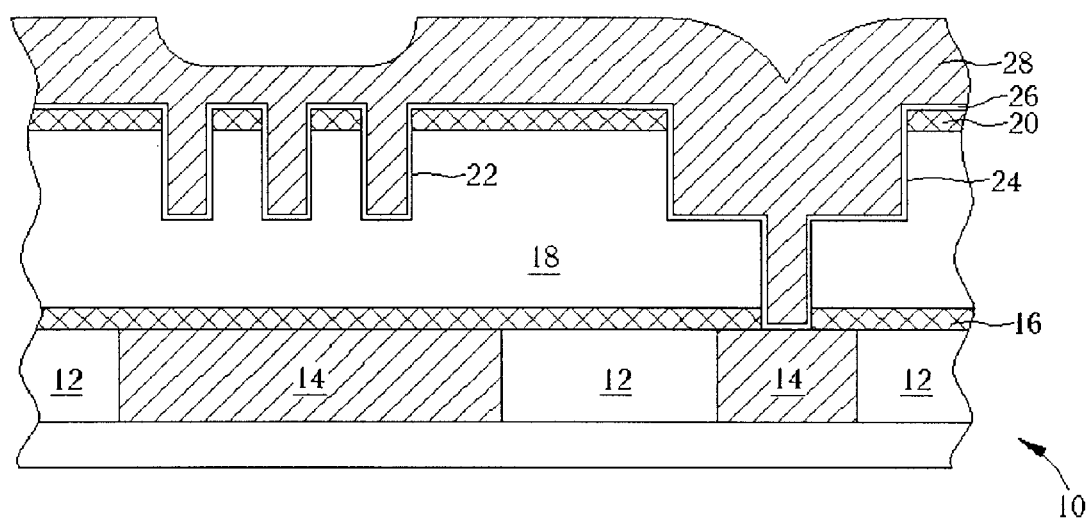

As shown in FIG. 3, a physical vapor deposition (PVD) process or a chemical vapor deposition (CVD) process is performed to form a liner layer (or a barrier layer) 26 on the semiconductor substrate 10. The liner layer 26 is formed of composite materials, such as tantalum/tantalum nitride/tantalum (Ta/TaN/Ta)to prevent diffusion of atoms from the conducting layer formed in the subsequent process of the interconnection structure 24 into the dielectric layer 18, and to increase adhesion between the conducting layer 14 and the interconnection structure 24. Following that, an electroplating process is performed to form a conductive layer, such as a copper metal layer 28 on the semiconductor substrate 10 to fill both the trenches 22 and the interconnection structure 24.

Figure 4:
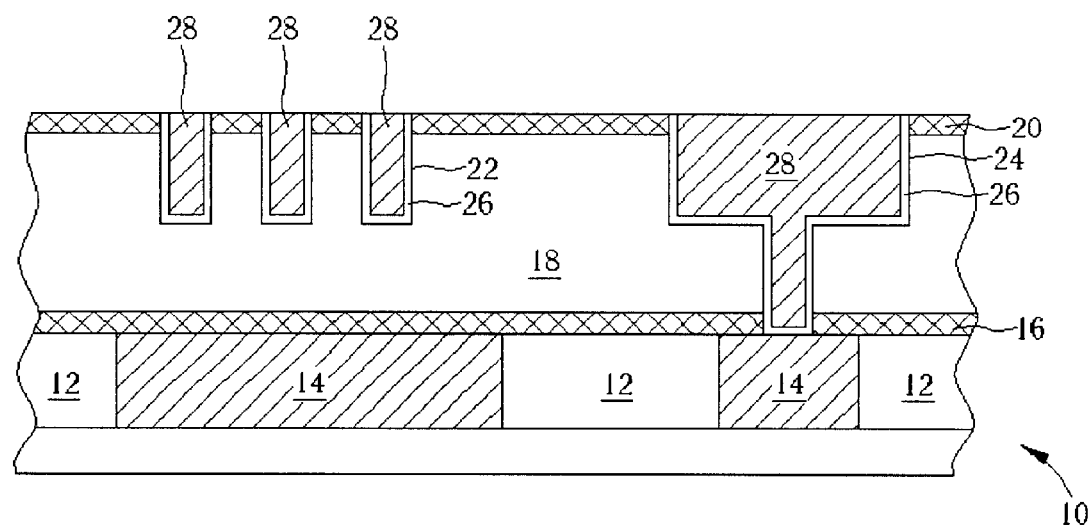
Figure 5:
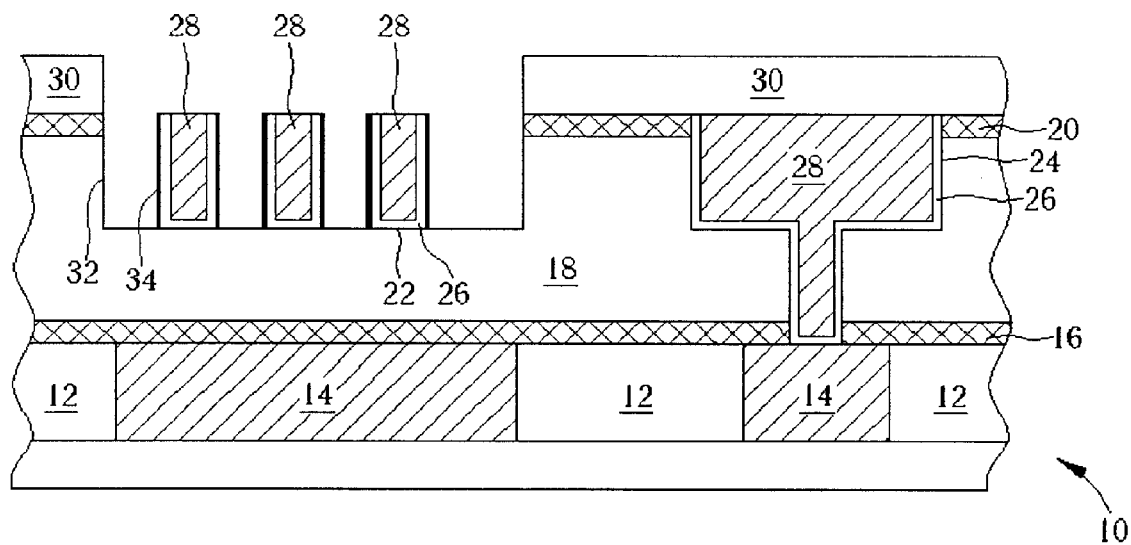

As shown in FIG. 4, a planarization process, such as a chemical mechanical polishing (CMP) process, an electropolishing process or an etching process is performed using the mask layer 20 as the stop layer to remove portions of the conductive layer 28 and the liner layer 26 to form a substantially smooth surface of the semiconductor substrate 10, and the interconnection structure 24 is completed. Then as shown in FIG. 5, a photoresist layer 30 is deposited on the interconnection structure 24, and then portions of the mask layer 20 and the dielectric layer 18 not covered by the photoresist layer 30 are removed to form at least one trench 32 in the dielectric layer 18 adjacent to the trenches 22. The trenches 32 are used to define a top electrode plate structure of the capacitor, and a joint side wall 34 is formed between each trench 32 and the adjacent trench 22.

Figure 6:
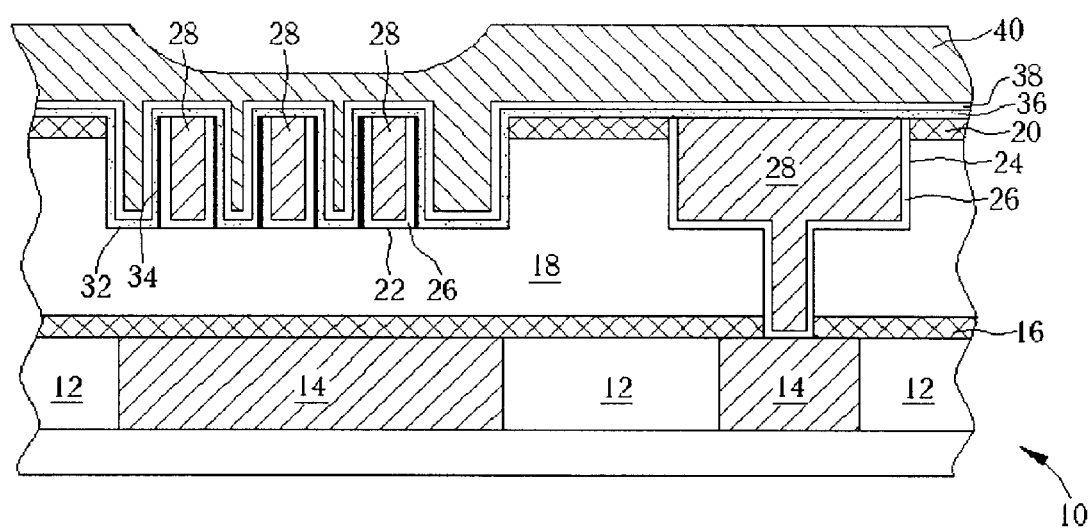

As shown in FIG. 6, after removing the photoresist layer 30, a PVD process or a CVD process is performed to form a capacitor dielectric layer 36 on the semiconductor substrate 10, which is composed of a silicon oxide layer, a silicon nitride layer, or other high-k dielectric materials having a dielectric constant greater than 4, such as tantalum pentoxide ($Ta_sO_5$), trioxide dialuminum ($Al_2O_3$), or (Ba,Sr)$TiO_3$(BSTO). Further, a liner layer (or a barrier layer) 38 is formed on the capacitor dielectric layer 36. After that, an electroplating process is performed to form a conductive layer, such as a copper metal layer 40 on the semiconductor substrate 10 to fill the trenches 32.

Figure 7:
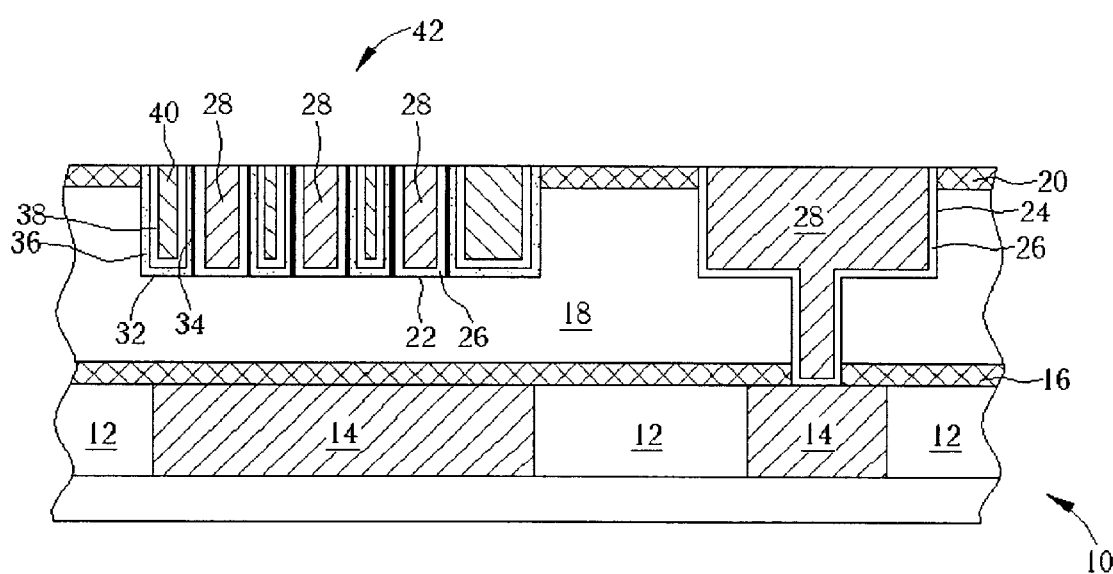

As shown in FIG. 7, a planarization process, such as a chemical mechanical polishing (CMP) process, an electropolishing process or an etching process is performed to remove portions of the conductive layer 40 and the liner layer 38 so as to expose the surface of the capacitor dielectric layer 36. Then, a CMP process or an etching process is performed to remove portions of the capacitor dielectric layer 36 until the surfaces of the conductive layer 28 and the conductive layer 40 are exposed, so that the conductive layer 28, the capacitor dielectric layer 36, and the conductive layer 40 constitute the high-density capacitor 42 having the 3-D structure. In the preferred embodiment of the present invention, a mask layer (not shown in FIG. 7) can be formed selectively on the semiconductor substrate 10 to cover and protect the high-density capacitor 42 and the interconnection structure 24.

Figure 8:
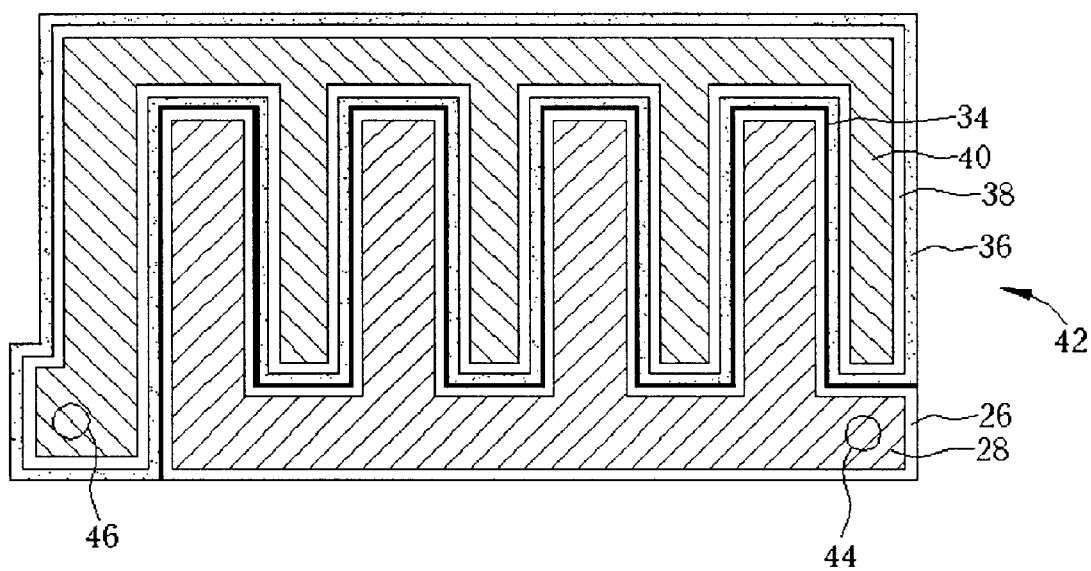
FIG. 8 is a top view of a high-density capacitor according to a first embodiment of the present invention.

Please refer to FIG. 8, which is a top view of a high-density capacitor 42 according to a first embodiment of the present invention. As shown in FIG. 8, the liner layer 26, the joint side wall 34, the capacitor dielectric layer 36, and the liner layer 38 are formed between the two conductive layers 28 and 40 of the high-density capacitor 42, and the conductive layers 28 and 40 are arranged in a comb-type pattern to increase the contact area between the top electrode plate and the bottom electrode plate so as to raise the capacitor density. In addition, since the conductive layers 28 and 40 are both lodged into the semiconductor substrate 10 so as to planarize the surface of the semiconductor substrate 10, and the conductive layers 28 and 40 can utilize contact plugs 44 and 46, which are both made of the same metal layer, to contact with other circuit devices, respectively. So the high-density capacitor 42 has a suitable electric potential difference to store the electric charges. In comparison with the conventional plate capacitor with stacked structure, since the heights of the top electrode plate and the bottom electrode plate are different, the contact plugs that are connected to the top metal layer and the bottom metal layer have to be formed respectively. Therefore, the present invention has advantages of simplifying the circuit design and raising the device density.

Figure 9:
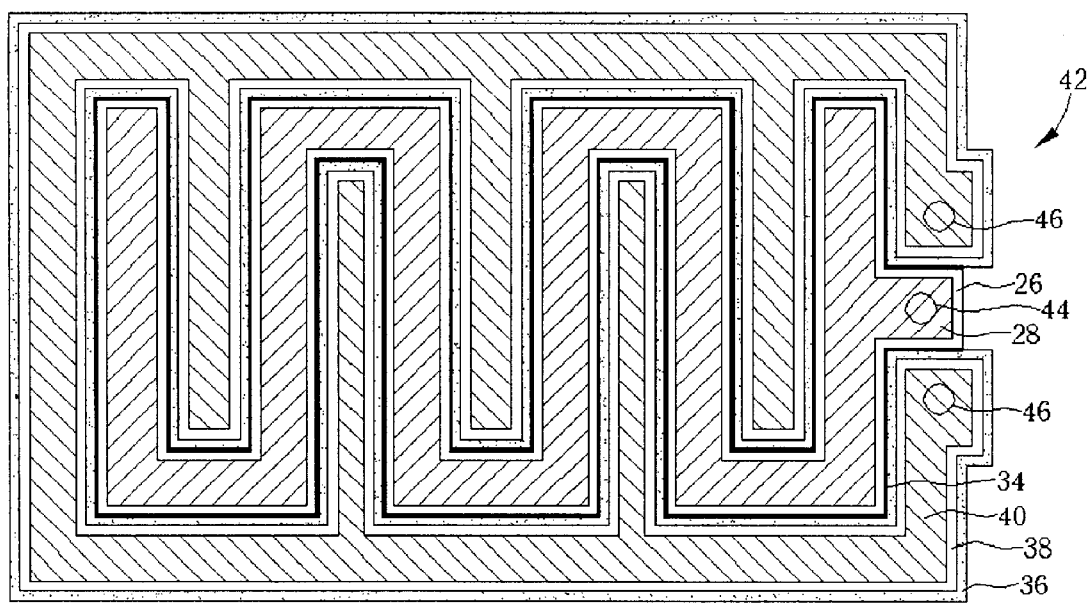
FIG. 9 is a top view of a high-density capacitor according to a second embodiment of the present invention.

Please refer to FIG. 9, which is a top view of a high-density capacitor 42 according to a second embodiment of the present invention. As shown in FIG. 9, the liner layer 26, the joint side wall 34, the capacitor dielectric layer 36, and the liner layer 38 are formed between the two conductive layers 28 and 40 of the high-density capacitor 42, and the conductive layers 28 and 40 are arranged in a snake-type pattern to increase the contact area between the top electrode plate and the bottom electrode plate so as to raise the capacitor density. In addition, the conductive layers 28 and 40 are both lodged into the semiconductor substrate 10 so as to planarize the surface of the semiconductor substrate 10, and the conductive layers 28 and 40 can utilize the contact plugs 44 and 46, which are both made of the same metal layer, to contact with other circuit devices, respectively. So the high-density capacitor 42 has a suitable electric potential difference to store the electric charges. In comparison with the conventional plate capacitor with stacked structure, since the heights of the top electrode plate and the bottom electrode plate are different, the contact plugs that are connected to the top metal layer and the bottom metal layer have to be formed respectively. Therefore, the present invention has advantages of simplifying-the circuit design and raising the device density.

Figure 10:
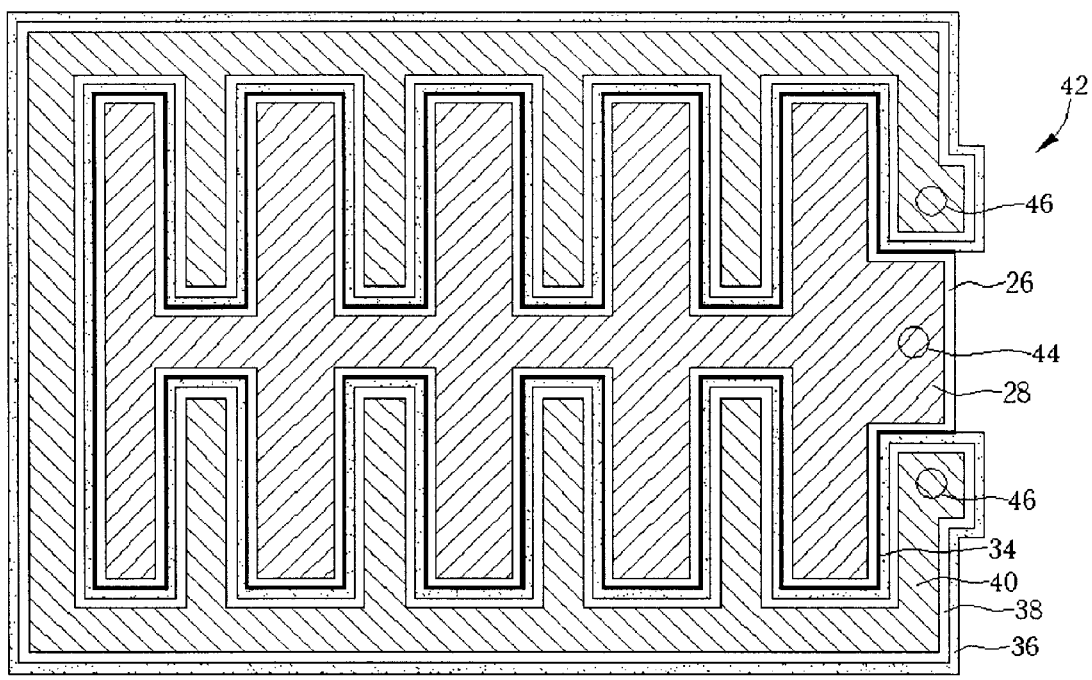
FIG. 10 is a top view of a high-density capacitor according to a third embodiment of the present invention.

Please refer to FIG. 10, which is a top view of a high-density capacitor 42 according to a third embodiment of the present invention. As shown in FIG. 10, the liner layer 26, the joint side wall 34, the capacitor dielectric layer 36, and the liner layer 38 are formed between the two conductive layers 28 and 40 of the high-density capacitor 42, and the conductive layers 28 and 40 are arranged in a maze-type pattern to increase the contact area between the top electrode plate and the bottom electrode plate so as to raise the capacitor density. In addition, the conductive layers 28 and 40 are both lodged into the semiconductor substrate 10 so as to planarize the surface of the semiconductor substrate 10, and the conductive layers 28 and 40 can utilize the contact plugs 44 and 46, which are both made of the same metal layer, to contact with other circuit devices, respectively. So the high-density capacitor 42 has a suitable electric potential difference to store the electric charges. In comparison with the conventional plate capacitor with stacked structure, since the heights of the top electrode plate and the bottom electrode plate are different, the contact plugs that are connected to the top metal layer and the bottom metal layer have to be formed respectively. Therefore, the present invention has advantages of simplifying the circuit design and raising the device density.

In comparison with the conventional plate capacitor stacked structure, the high-density capacitor of the present invention has the 3-D structure so as to reduce the chip area substantially, increase the capacitor density, and increase the device integration. In addition, the top electrode plate and the bottom electrode plate are both lodged into the dielectric layer positioned on the semiconductor substrate, so that the capacitor process of the present invention can be integrated with other interconnection processes. Only one photo mask is utilized to form the trench structures of the capacitor and the interconnection so as to simplify the processes, decrease numbers of the photo masks, and reduce the production costs.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for fabricating a high-density capacitor in a semiconductor substrate that comprises a dielectric layer, the method comprising:

forming at least one first trench in the dielectric layer;

forming a first liner layer on the semiconductor substrate and a first conductive layer on the first liner layer that fills the first trench;

removing portions of the first conductive layer and the first liner layer to planarize the surface of the semiconductor substrate;

forming at least one second trench having a joint side wall with the first trench in the dielectric layer;

forming a capacitor dielectric layer on the semiconductor substrate;

forming a second liner layer on the semiconductor substrate and a second conductive layer on the second liner layer that fills the second trench;

removing portions of the second conductive layer and the second liner layer to planarize the surface of the semiconductor substrate; and removing portions of the capacitor dielectric layer to expose the surfaces of the first conductive layer and the second conductive layer, so that the first conductive layer, the capacitor dielectric layer and the second conductive layer constitute the high-density capacitor having a vertical three-dimensional (3-D) structure.

2. The method of claim 1 wherein the high-density capacitor is a metal-insulator-metal capacitor (MIMCap).

3. The method of claim 1 wherein the first conductive layer is a copper (Cu) metal layer.

4. The method of claim 1 wherein the second conductive layer is-a copper metal layer.

5. The method of claim 1 wherein a dielectric constant of the dielectric layer is less than 3.

6. The method of claim 1 wherein a dielectric constant of the capacitor dielectric layer is greater than 4.

7. The method of claim 1 wherein the first trench and an interconnection structure are formed in the dielectric layer by utilizing a photo-etching process (PEP) simultaneously.

8. The method of claim 7 wherein the interconnection structure is a single damascene structure.

9. The method of claim 7 wherein the interconnection structure is a dual damascene structure.

10. The method of claim 7 wherein the interconnection structure is a contact plug.

11. The method of claim 7 wherein the interconnection structure is a landing via.

12. A method for fabricating a high-density capacitor in a semiconductor substrate that comprises a dielectric layer, the method comprising:

forming at least one first trench and an interconnection structure in the dielectric layer simultaneously;

forming a first liner layer on the semiconductor substrate and a first conductive layer on the first liner layer that fills the first trench and the interconnection structure;

removing portions of the first conductive layer and the first liner layer to planarize the surface of the semiconductor substrate;

forming at least one second trench having a joint side wall with the first trench in the dielectric layer;

forming a capacitor dielectric layer on the semiconductor substrate;

forming a second liner layer on the semiconductor substrate and a second conductive layer on the second liner layer that fills the second trench;

removing portions of the second conductive layer and the second liner layer to planarize the surface of the semiconductor substrate; and removing portions of the capacitor dielectric layer to expose the surfaces of the first conductive layer and the second conductive layer, so that the first conductive layer, the capacitor dielectric layer, and the second conductive layer constitute the high-density capacitor having a vertical three-dimensional structure.

13. The method of claim 12 wherein the high-density capacitor is a metal-insulator-metal capacitor.

14. The method of claim 12 wherein the first conductive layer is a copper metal layer.

15. The method of claim 12 wherein the second conductive layer is a copper metal layer.

16. The method of claim 12 wherein a dielectric constant of the dielectric layer is less than 3.

17. The method of claim 12 wherein a dielectric constant of the capacity dielectric layer is greater than 4.

18. The method of claim 12 wherein the interconnection structure is a single damascene structure.

19. The method of claim 12 wherein the interconnection structure is a dual damascene structure.

20. The method of claim 12 wherein the interconnection structure is a contact plug.

21. The method of claim 12 wherein the interconnection structure is a landing via.

* * * * *